United States Patent [19]
Ohsawa

[11] Patent Number: 5,682,393
[45] Date of Patent: Oct. 28, 1997

[54] PATTERN GENERATOR FOR CYCLE DELAY

[75] Inventor: Toshimi Ohsawa, Gyoda, Japan

[73] Assignee: Advantest Corp., Tokyo, Japan

[21] Appl. No.: 515,264

[22] Filed: Aug. 15, 1995

[30]    Foreign Application Priority Data

Aug. 19, 1994   [JP]   Japan ................................. 6-218113

[51] Int. Cl.$^6$ ................................................. G01R 31/28
[52] U.S. Cl. ............................. 371/27; 371/62; 395/552
[58] Field of Search ............................. 371/27, 62, 61,
371/15.1, 21.1, 21.6; 364/270, 271.5, 271.6,
950, 950.4, 950.5; 395/185.08, 552, 558,
559

[56]              References Cited

U.S. PATENT DOCUMENTS

| 4,415,984 | 11/1983 | Gryger et al. ........................... 364/900 |
| 4,835,774 | 5/1989 | Ooshima et al. ......................... 371/25 |
| 5,062,109 | 10/1991 | Ohshima et al. ....................... 371/21.1 |
| 5,265,102 | 11/1993 | Saito ......................................... 371/27 |
| 5,321,700 | 6/1994 | Brawn et al. .............................. 371/27 |
| 5,390,192 | 2/1995 | Fujieda ..................................... 371/27 |
| 5,426,771 | 6/1995 | Asprey et al. ........................ 364/950.4 |

*Primary Examiner*—Robert W. Beausoliel, Jr.
*Assistant Examiner*—Trinh L. Tu
*Attorney, Agent, or Firm*—Knobbe, Martens, Olson & Bear, LLP

[57]                    ABSTRACT

A pattern generator facilitates the pattern generation of an electronics device to be measured such as SDRAM where each input and output signal cycle is not matched. The pattern generator includes a first address signal delay section that applies a cycle delay to a first address signal based on the number set in a first delay register, a second address signal delay section that applies a cycle delay to a second address signal based on the number set in a second delay register, a data signal delay section that applies a cycle delay to a data signal based on the number set in a data delay register, a control signal delay section that applies cycle delay to a control signal based on the number set in a control delay register.

4 Claims, 5 Drawing Sheets

SDRAM READ TIMING

SDRAM WRITE TIMING

PATTERN GENERATOR FOR CYCLE DELAY

FIELD OF THE INVENTION

The present invention relates to a test pattern generator for generating test patterns to test electronics devices, and more particularly, to a test pattern generator that facilitates the pattern generation of a device to be measured, for example a synchronous DRAM, where each input and output signal cycle of the device is not matched.

BACKGROUND OF THE INVENTION

Generally, a semiconductor test system is required to test a device to be measured at high speeds and generate test patterns for this purpose.

The composition of the semiconductor test system that tests the quality of a device to be measured is shown in FIG. 3. Art example of FIG. 3 shows the structure of the test system where the device to be measured is a memory. Address, data and control signals from a pattern generator 1 for a memory to be tested are supplied to a waveform shaper 2. These signals are shaped in the waveform shaper 2 and supplied to a memory 3 to be tested and written.

Next, data retrieved from the memory 3 to be tested is compared at a logical comparator 4 with an expected value signal output from the pattern generator 1. However, in this case, the logical comparator 4 determines either pass or fail by comparing data being retrieved from the memory 3 to be measured with the expected value impressed from the pattern generator 1 only when a comparison enable signal (hereinafter referred to as CPE signal) impressed from the pattern generator 1 is a logical value "1".

A fail memory 5 stores fail information for each address by a fail signal output from the logical comparator 4 and a FM address signal supplied from the pattern generator 1. The above series of operation is all synchronized with a clock impressed to each section from a timing generator 6.

FIG. 4 illustrates a block diagram of the pattern generator 1. An operation control memory 12 is accessed by data output from a sequence control section 11. An output of the operation control memory 12 is impressed to an address generating section 13, data generating section 14, control signal generating section 15, which generate an address signal, data and expected value signals and control signal respectively. In addition, the expected value signal generated from the data generation section 14 is sent to a data delay section 16. In the data delay section 16, the signal is cycle-delayed by a value set in a delay register 162 at a cycle delay section 161 and impressed to the logical comparator 4.

Similarly, the CPE signal generated from the control signal generation section 15 is sent to the data delay section 16. In the data delay section 16, a value set in a delay register 162 is cycle-delayed by the cycle delay section 161 and impressed to the logical comparator 4. Similarly, the FM address Signal generated from the address generation section 13 is fed into the data delay section 16. In the data delay section 16, the signal is cycle-delayed by a value set in a delay register 164 at a cycle delay section 163 and impressed to the fail memory 5.

Note that in measuring a standard memory without cycle delays, the data delay section 16 is used by setting the amount of delays to zero. There is a case where the output data from the device to be measured is retrieved after multiple cycles with respect to the input address depending on the kind of devices. In order to test the device to be measured, a function that allows the expected value signal, CPE signal, and FM address signal to be delayed arbitrarily is arranged in the pattern generator 1 as described above.

Recently, the devices to be measured have realized their operating speeds increase, and synchronous DRAM is beginning to be in greater use. The synchronous DRAM (SDRAM) in place of conventional DRAM is a memory that can have a continuous access at high speeds. It has a special architecture for speeding up the continuous access, and it is possible to read and write at a rate of greater that 100 Mbytes/sec. In order to speed up the continuous access, the read and write of SDRAM are performed in a burst mode. This method is to read and write data in the same low address by an unit of 2, 4, or 8 words, etc. In addition, the access is sped up by simply providing the start address of a block, which is incremented inside SDRAM thereafter.

FIG. 5 illustrates an example of the read timing of SDRAM. FIG. 6 illustrates an example of the write timing of SDRAM. As shown in these figures, the SDRAM timing has the following characteristics.

First, during writing, the input cycles of the row address, column address, write data, /CAS (column address strobe), and /WE (write enable) are delayed by 3 cycles.

Second, during reading, the input cycles of the row address, column address, and /CAS are delayed by 3 cycles, further the read data is retrieved 2 cycles after the column address.

Note that a delay from the column address is called CAS latency and it is programmable.

As described above, the test pattern generation for a memory with a delay between the input and output timing such as SDRAM could not simply measure only by the delay function of the address, expected value, and CPE as the conventional pattern generator.

SUMMARY OF THE INVENTION

The purpose of this invention is to eliminate those shortcomings and offer a pattern generator for cycle delay that facilitates the pattern generation of the device to be measured such as SDRAM where each input and output cycle of the address, data, and control signals is not matched.

In the pattern generator that test the device to be measured, the first address signal delay section 130 that applies the output of the address generation section 13 and performs cycle delays by the number of setting of a delay register 132 at a cycle delay section 131 is arranged. Similarly, the second address signal delay section 170 that applies the output of the address generation section 13 and performs arbitrary cycle delays is arranged. Similarly, a data signal delay section 140 that applies the output of the data generation section 14 and performs arbitrary cycle delays is arranged. Similarly, a control signal delay section 150 that applies the output of the control signal generation section 15 and performs arbitrary cycle delays is arranged.

Furthermore, the control signal delay section 150 may also be composed of:

a delay register 152 that sets the number of delay cycles, a cycle delay section 151 that performs cycle delays of the input by the number of delay cycles, a delay selection register 154 that selects which signal to be delayed among multiple control signals, and a selector 153 that selects a control signal which performs cycle delays in response to the output of the delay selection register 154.

In accordance with this invention, if the input data, column address, /CAS, /WE, expected value, CPE, and FM (fail memory) address are set to be delayed in the pattern generator, the input and output timing of the logical comparator 4 and fail memory 5 becomes matched. Therefore, it is possible to generate a test pattern of memory with the delay input timing of the address, data, control signals, etc. as they are input with the same timing. Furthermore, a memory with the cycle-delayed output data can be handled in the same manner.

DETAILED DESCRIPTION OF THE INVENTION

The embodiment of the present invention is explained by referring to the figures.

Figure 1:
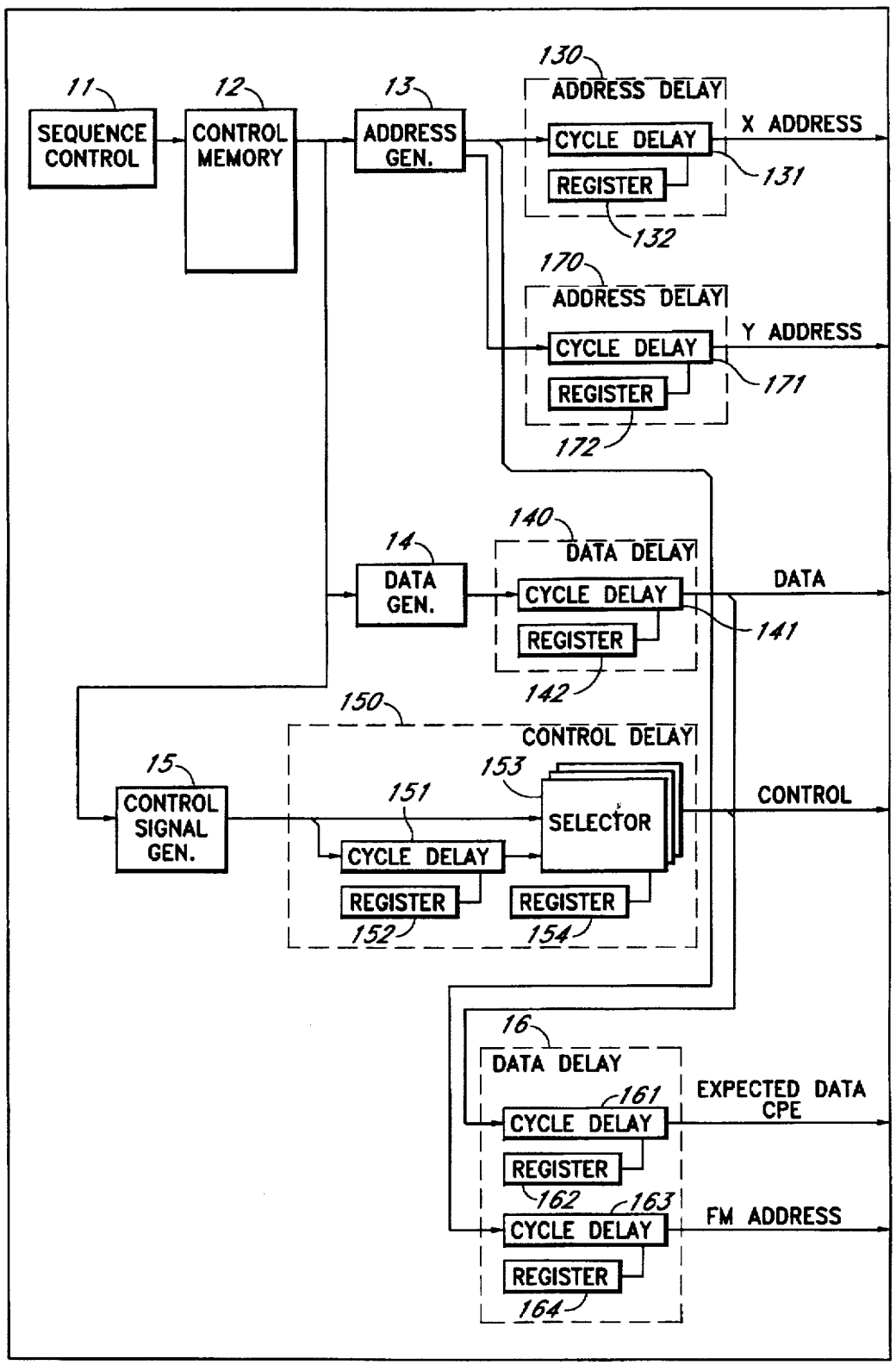
FIG. 1 is a block diagram of the pattern generator showing the embodiment of this invention.

FIG. 1 is a block diagram of the pattern generator showing the embodiment of this invention.

As shown in FIG. 1, in addition to the conventional data delay section 16, the X address signal delay section 130, Y address signal delay section 170, data signal delay section 140 and control signal delay section 150 are newly arranged in the pattern generator.

The X address signal delay section 130 and Y address signal delay section 170 makes it possible to independently perform arbitrary cycle delays of two systems of the row address and column address. Each delay section has registers (132, 172), which set delay cycles, and cycle delay sections (131, 171), which perform cycle delays of each signal by the register values.

The data signal delay section 140 makes it possible to delay the input and output data by arbitrary cycles. The data signal delay section 140 has a register 142, which set delay cycles, and a cycle delay section 141, which performs cycle delays of the signal by the register value.

The control signal delay section 150 makes it possible to perform arbitrary cycle delays of control signals such as /RAS (row address strobe), /CAS, /WE, CPE etc. The control signal delay section 150 has a register 152, which set delay cycles, and a cycle delay section 151, which performs cycle delays of the signal by the register value.

Furthermore, The control signal delay section 150 has a delay selection register 154, which selects which signal to be delayed among the control signals, and a selector 153, and makes it possible to delay arbitrary signals among the control signals.

This composition makes it possible to generate a test pattern of memory with the offset input timing of the address, data, control signals, etc. as they are input with the same timing. Furthermore, a memory with the cycle-delayed output data may be handled in the same manner.

Figure 2:
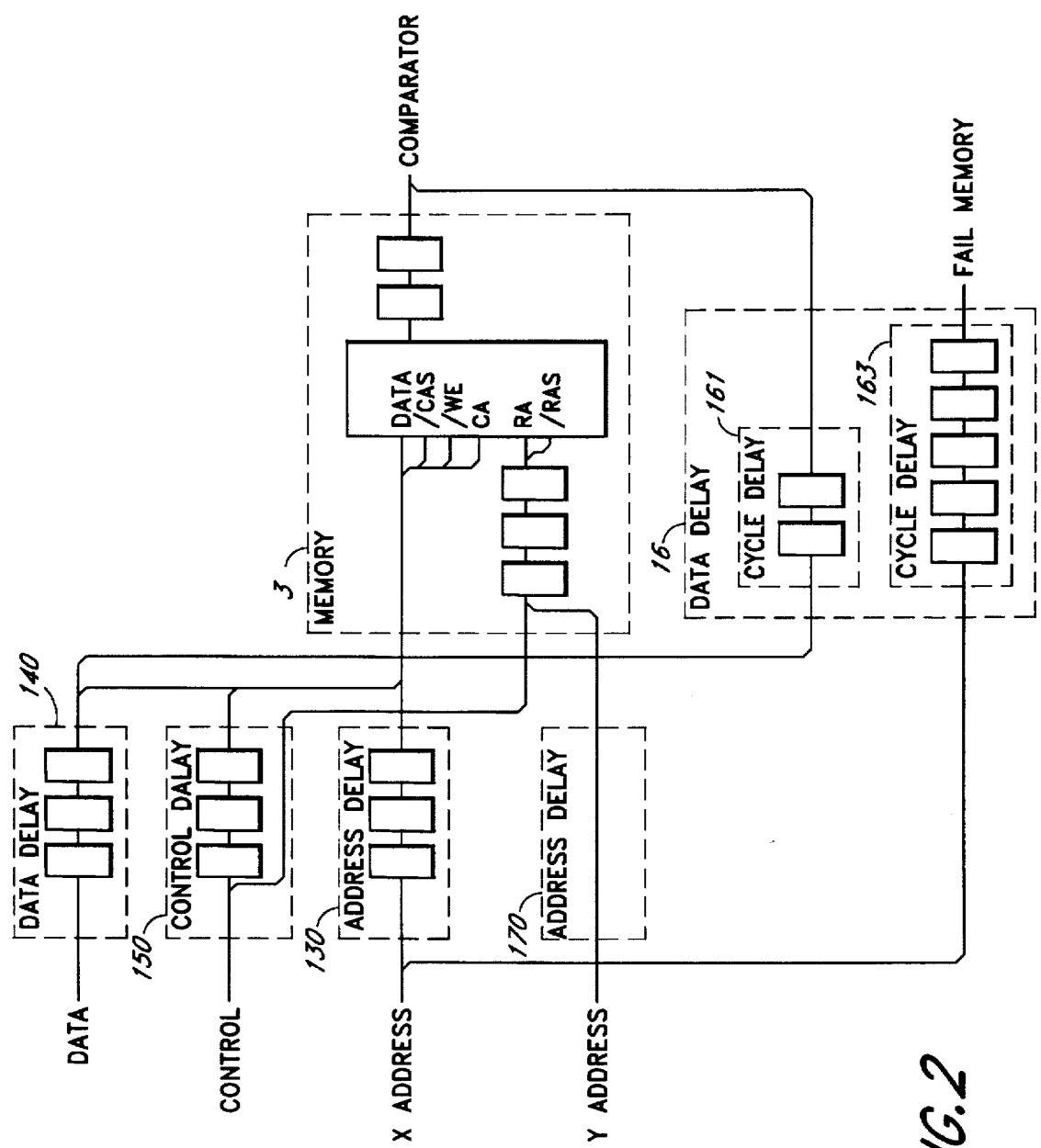
FIG. 2 shows a relationship between the cycle delay of SDRAM 3 and the cycle delay performed in this pattern generator.
Figure 3:
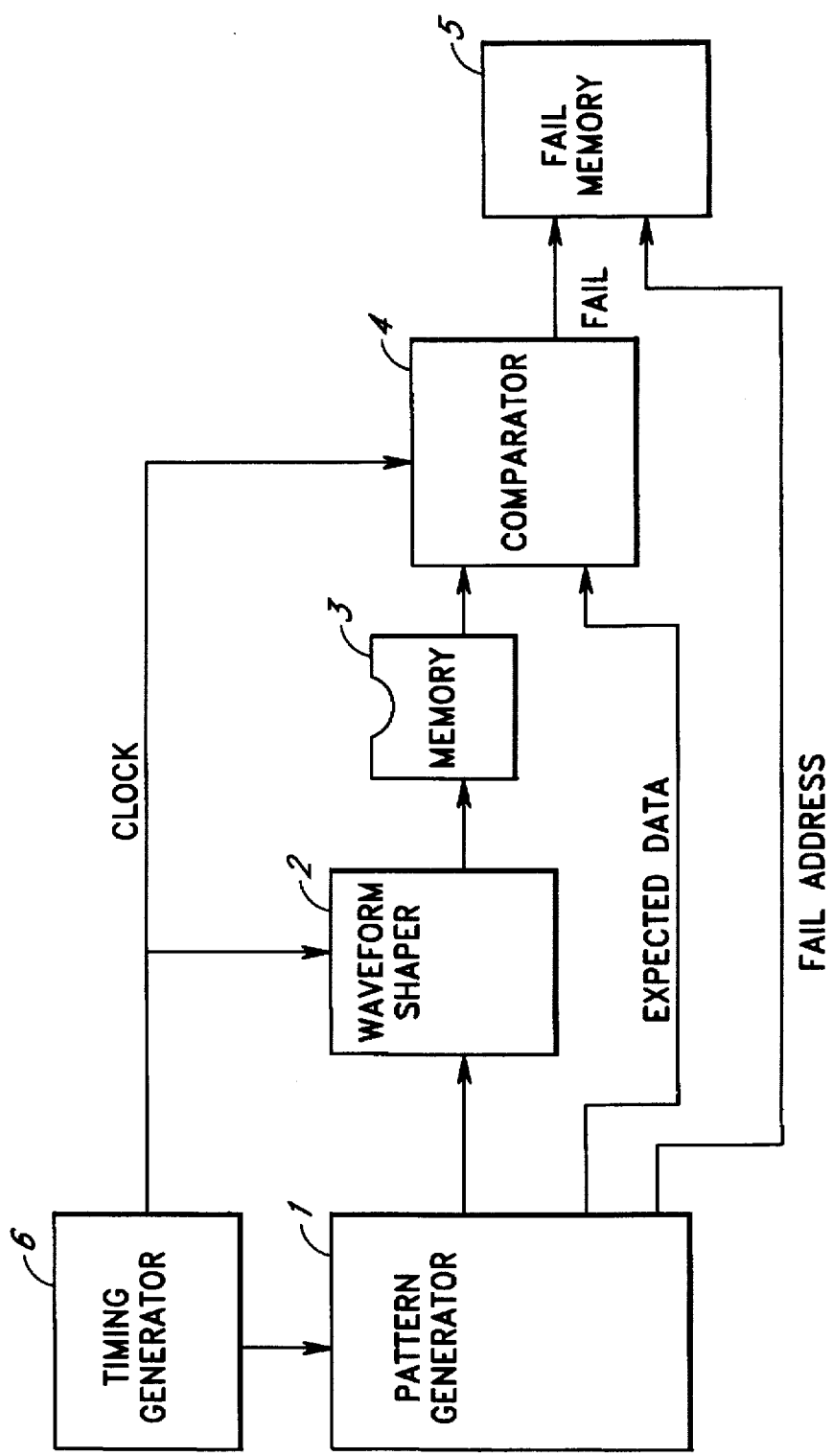
FIG. 3 shows an example of composition of the conventional semiconductor test system that tests the quality of a device to be measured.
Figure 4:
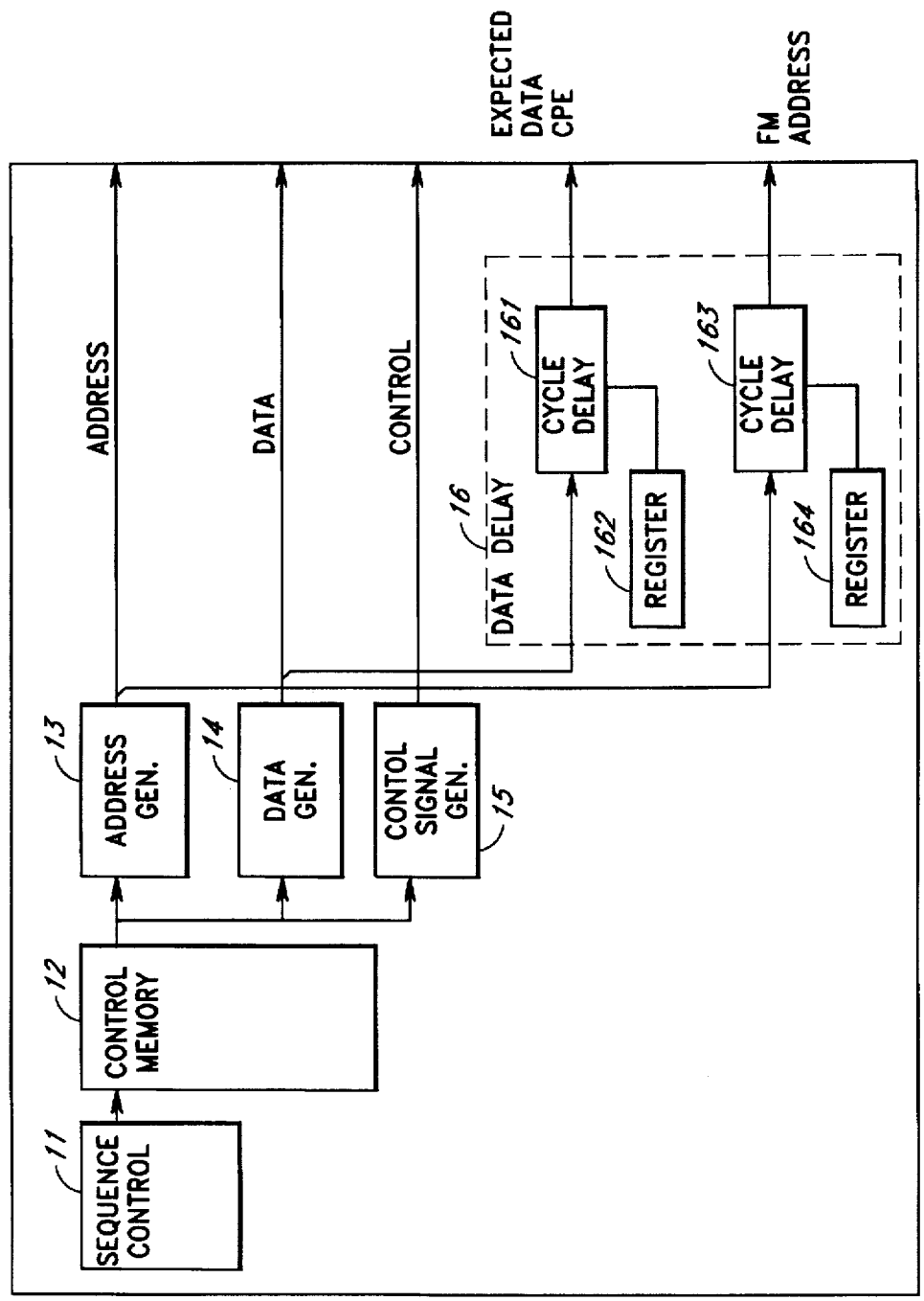
FIG. 4 illustrates a block diagram of the pattern generator 1.
Figure 5:
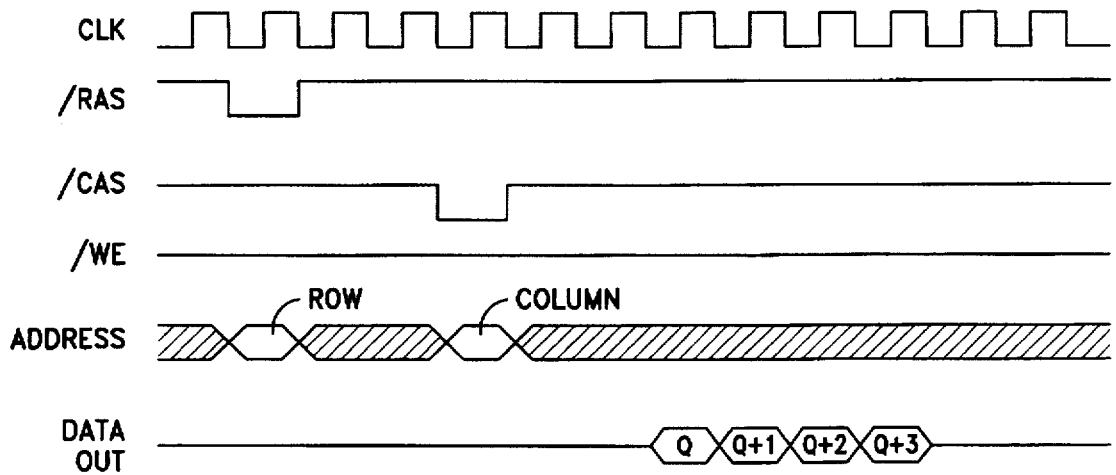
FIG. 5 shows an example of the read timing of SDRAM.
Figure 6:
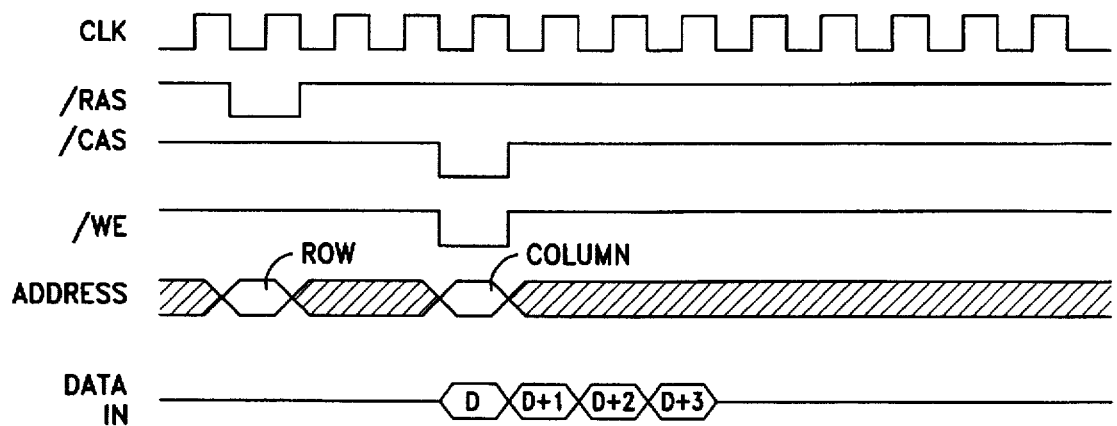
FIG. 6 shows an example of the write timing of SDRAM.

FIG. 2 shows a relationship between the cycle delay of SDRAM 3 and the cycle delay performed in this pattern generator. Note that the number of cycles in SDRAM is the same as the number indicated as an example in FIGS. 5 and 6.

As for assigning signals, the Y address is assigned to the row address, the X address is assigned to the column address, and the control signal is assigned to /RAS (row address strobe), /CAS, and /WE. The row address, /RAS, and output data in SDRAM are considered to be cycle-delayed.

Hence, , if the input data, column address, /CAS, /WE, expected value, CPE, and FM address are set to be delayed in the pattern generator, the input and output timing of the logical comparator 4 and file memory 5 becomes matched.

As for the number of cycle delays, the row address and /CAS are set without delay, the column address, input data, /CAS, and /WE are set to a 3 cycle delay, and the expected value and FM address are set to a 5 cycle delay.

FIG. 2 shows an example of values to be set in the registers as follows:

(1) X address signal delay register; 3
(2) Y address signal delay register; 0
(3) Data signal delay register; 3
(4) Control signal delay register; 3

Note that /CAS and /WE are set to delay using the delay selection register.

(5) FM address signal delay register; 5
(6) Expected value signal register; 2

Note that the data generation system is already delayed by 3 cycles at the data signal delay section 140. As 5 cycles are needed as the delay of the expected value, it is set to 5−3=2.

By the above setting, it is possible to make a pattern program without considering a difference in the input timing of each signal and the delay of the read-out data.

As this invention is composed as explained above, it has the following effects. It could offer a pattern generator that facilitates the pattern generation of a device to be measured such as SDRAM where the input and output signal cycles of the address, data, and control signal etc. are not matched.

What is claimed is:

1. A pattern generator for adjusting a delay time of a memory device to be tested, comprising:

a first address delay circuit (130) for applying a first address delay time to first address data from an address generation circuit (13), said first address determining a column address of said memory device;

a second address delay circuit (170) for applying a second address delay time to second address data from said address generation circuit (13), said second address determining a row address of said memory device;

a data delay circuit (140) for applying a data delay time to test data from a data generation circuit (14), said test data provided with said data delay time being applied to said memory device to be tested; and a control signal delay circuit (150) for applying a control delay time to a plurality of control signals from a control signal generation circuit (15), said control signal delay circuit (150) including a selector (153) which selects one or more of said plurality of control signals provided with said control delay time, a delay selection register (154) which provides information to said selector (153) to select said control signals, a cycle delay (151) which provides said control delay time to said control signals, and a delay register (152) which provides information to said cycle delay (151) to determine a length of said control delay time, said control signal selected by said selector being supplied to said memory device to control an operation of said memory device.

2. A pattern generator as defined in claim 1, further comprising:

an expected data delay circuit for applying an expected data delay time to expected data from said data generation circuit (14), said expected data provided with said expected data delay time being supplied to a comparator which compares an output signal from said memory device with said expected data; and a fail memory address delay circuit for applying a fail address delay time to said first and second address from said address generation circuit (13), said first and second address provided with said fail address delay time being supplied to a fail memory which stores fail information on said memory device when said comparator generates a fail signal.

3. A pattern generator as defined in claim 1, wherein each of said first, second address and data delay circuits (130, 170 and 140) includes a set of a cycle delay (131, 171 and 141) and a register (132, 172 and 142), said cycle delay causing a delay time which is an integer multiple of a clock signal of said pattern generator and said register storing information designating a number of clock cycles to be delayed by said cycle delay.

4. A pattern generator as defined in claim 1, wherein said cycle delay (151) in said control delay circuit (150) generates said control delay time which is an integer multiple of a clock signal of said pattern generator and said delay register (152) stores said information designating a number of clock cycles to be delayed by said cycle delay (151).

* * * * *